United States Patent
Kim et al.

(10) Patent No.: US 12,016,202 B2
(45) Date of Patent: Jun. 18, 2024

(54) DISPLAY DEVICE AND METHOD OF PROVIDING THE SAME

(71) Applicant: Samsung Display Co., LTD., Yongin-si (KR)

(72) Inventors: Jungi Kim, Hwaseong-si (KR); Jin-Su Byun, Seoul (KR); Woongsik Kim, Gyeonggi-do (KR); Jeong Won Kim, Gyeonggi-do (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 1 day.

(21) Appl. No.: 17/892,229

(22) Filed: Aug. 22, 2022

(65) Prior Publication Data

US 2023/0122766 A1   Apr. 20, 2023

(30) Foreign Application Priority Data

Oct. 15, 2021 (KR) ........................ 10-2021-0137386

(51) Int. Cl.
| | |
|---|---|
| G09G 3/20 | (2006.01) |
| G06F 3/041 | (2006.01) |
| H10K 50/858 | (2023.01) |
| H10K 59/40 | (2023.01) |
| H10K 71/00 | (2023.01) |
| H10K 59/12 | (2023.01) |
| H10K 59/122 | (2023.01) |

(52) U.S. Cl.
CPC ......... *H10K 50/858* (2023.02); *G06F 3/0412* (2013.01); *H10K 59/40* (2023.02); *H10K 71/00* (2023.02); *H10K 59/1201* (2023.02); *H10K 59/122* (2023.02)

(58) Field of Classification Search
CPC ...... H10K 50/858; H10K 59/40; H10K 71/00; H10K 59/1201; H10K 59/122; H10K 50/8445; G06F 3/0412; G06F 3/0443; G06F 3/0446; G06F 2203/04103
USPC ............................................. 345/173, 55, 82
See application file for complete search history.

(56) References Cited

U.S. PATENT DOCUMENTS

| | | | | |
|---|---|---|---|---|
| 2016/0221315 | A1* | 8/2016 | Saiki | ................ B32B 27/08 |
| 2016/0372702 | A1* | 12/2016 | Xu | .................. H10K 59/00 |
| 2019/0115395 | A1 | 4/2019 | Lee et al. | |

(Continued)

FOREIGN PATENT DOCUMENTS

| | | |
|---|---|---|
| CN | 111509141 A | 8/2020 |
| KR | 1020190041558 A | 4/2019 |

(Continued)

OTHER PUBLICATIONS

European Search Report for European Patent Application No. 22198161.6 dated Feb. 28, 2023.

*Primary Examiner* — Thuy N Pardo

(74) *Attorney, Agent, or Firm* — CANTOR COLBURN LLP

(57) ABSTRACT

A display panel includes a transmission area, a boundary area adjacent to the transmission area, a display area adjacent to the boundary area, an overcoat layer in the boundary area, a light emitting element in the display area, a first refractive layer on the light emitting element and including the same material as the overcoat layer, and a second refractive layer on the first refractive layer and having a refractive index less than a refractive index of the first refractive layer.

19 Claims, 14 Drawing Sheets

(56) References Cited

U.S. PATENT DOCUMENTS

| | | | | |
|---|---|---|---|---|
| 2020/0020748 A1* | 1/2020 | Jung | ................ | H10K 59/40 |
| 2020/0111844 A1* | 4/2020 | Jing | ................ | G06F 3/0445 |
| 2020/0243802 A1* | 7/2020 | Ju | ................ | H10K 50/86 |
| 2020/0357871 A1* | 11/2020 | Chung | ................ | H10K 50/865 |
| 2021/0200382 A1 | 7/2021 | Lee et al. | | |
| 2021/0210723 A1* | 7/2021 | Han | ................ | H10K 50/844 |
| 2021/0242283 A1* | 8/2021 | Lee | ................ | H10K 71/00 |
| 2021/0249624 A1* | 8/2021 | Lou | ................ | H10K 59/122 |
| 2022/0020962 A1* | 1/2022 | Kim | ................ | G02B 30/32 |
| 2022/0123256 A1* | 4/2022 | Hyun | ................ | G06F 1/1626 |

FOREIGN PATENT DOCUMENTS

| | | |
|---|---|---|
| KR | 1020190062678 A | 6/2019 |
| KR | 1020200075597 A | 6/2020 |
| KR | 1020200089379 A | 7/2020 |
| KR | 102262677 B1 | 6/2021 |

\* cited by examiner

DISPLAY DEVICE AND METHOD OF PROVIDING THE SAME

This application claims priority to Korean Patent Application No. 10-2021-0137386, filed on Oct. 15, 2021, and all the benefits accruing therefrom under 35 U.S.C. § 119, which is hereby incorporated by reference for all purposes as if fully set forth herein.

BACKGROUND

1. Field

Embodiments relate to a display device and method of providing (or manufacturing) the same.

2. Description of the Related Art

Flat panel display devices are replacing cathode ray tube display devices as display devices, due to their lightweight and thin characteristics. As representative examples of such flat panel display devices, there are liquid crystal display devices and organic light emitting diode display devices.

The display device may display an image using a light emitting element. In the display device, light generated from the light emitting element is directed to the front direction of the display device. However, the light generated from the light emitting element travels in several directions including the front direction and the side direction. Accordingly, a luminance in the front direction may be lowered.

SUMMARY

Embodiments provide a display device with improved light efficiency.

Embodiments also provide a method of providing (or manufacturing) a display device with improved light efficiency.

Additional features will be set forth in the description which follows, and in part will be apparent from the description, or may be learned by practice of the invention.

A display panel according to an embodiment includes a transmission area, a boundary area adjacent to the transmission area, and a display area adjacent to the boundary area, an overcoat layer in the boundary area, a light emitting element in the display area, a first refractive layer on the light emitting element and including the same material as the overcoat layer, and a second refractive layer on the first refractive layer and having a refractive index less than a refractive index of the first refractive layer.

In an embodiment, the second refractive layer may overlap the first refractive layer and the overcoat layer.

In an embodiment, the display device may further include a first touch insulating layer between the first refractive layer and the second refractive layer, covering the first refractive layer, and overlapping the overcoat layer.

In an embodiment, the first touch insulating layer may directly contact an upper surface of the first refractive layer and an upper surface of the overcoat layer.

In an embodiment, the first touch insulating layer may have a refractive index greater than the refractive index of the first refractive layer.

In an embodiment, the display device may further include a first touch electrode layer on the first touch insulating layer, a second touch insulating layer between the first touch insulating layer and the second refractive layer, covering the first refractive layer and the first touch electrode layer on the first touch insulating layer, and overlapping the overcoat layer, and a second touch electrode layer on the second touch insulating layer.

In an embodiment, the second touch insulating layer may have a refractive index greater than the refractive index of the first refractive layer.

In an embodiment, the second refractive layer may directly contact an upper surface of the second touch insulating layer.

In an embodiment, the display device may further include a first touch electrode layer between the first touch insulating layer and the second refractive layer, and a second touch electrode layer on the second refractive layer. The second refractive layer may cover the first touch electrode layer on the first touch insulating layer, and may overlap the overcoat layer.

In an embodiment, the second refractive layer may directly contact an upper surface of the second touch insulating layer.

In an embodiment, the display device may further include a first inorganic encapsulation layer covering the light emitting element, an organic encapsulation layer on the first inorganic encapsulation layer, and a second inorganic encapsulation layer on the organic encapsulation layer and directly contacting a lower surface of the first refractive layer and a lower surface of the overcoat layer.

In an embodiment, the light emitting element may include an anode electrode, an emission layer on the anode electrode, and a cathode electrode on the emission layer. The first refractive layer may overlap the emission layer.

In an embodiment, a plurality of grooves may be defined in the boundary area. The overcoat layer may fill the plurality of grooves.

A method of manufacturing a display device according to an embodiment includes providing a light emitting element in a display area, a transmission area, a boundary area which is between the transmission area and the display area, providing an organic layer in the display area and the boundary area, providing a first refractive layer on the light emitting element and an overcoat layer in the boundary area by patterning the organic layer, and providing a second refractive layer on the first refractive layer, the second refractive layer having a refractive index less than a refractive index of the first refractive layer.

In an embodiment, the second refractive layer may overlap the first refractive layer and the overcoat layer.

In an embodiment, the providing of the first refractive layer and the overcoat layer may include patterning the organic layer using a halftone mask.

In an embodiment, the method may further include providing a first touch insulating layer covering the first refractive layer, overlapping the overcoat layer, and having a refractive index greater than the refractive index of the first refractive layer, and providing a first touch electrode layer on the first touch insulating layer.

In an embodiment, the method may further include providing a second touch insulating layer on the first touch insulating layer, the second touch insulating layer covering the first refractive layer, the first touch electrode layer, and the overcoat layer, overlapping the overcoat layer, and having a refractive index greater than the refractive index of the first refractive layer, and providing a second touch electrode layer on the second touch insulating layer.

In an embodiment, the method may further include providing a second touch electrode layer on the second refractive layer.

In an embodiment, the method may further include providing a first inorganic encapsulation layer covering the light emitting element in the display area and the boundary area, providing an organic encapsulation layer in the display area on the first inorganic encapsulation layer, and providing a second inorganic encapsulation layer covering the organic encapsulation layer in the display area and the boundary area on the first inorganic encapsulation layer. The organic layer may be provided on an upper surface of the second inorganic encapsulation layer.

The display device according to one or more embodiment may include the first refractive layer and the second refractive layer. The first refractive layer may be on the light emitting element, and may overlap the emission layer included in the light emitting element. The second refractive layer may cover the first refractive layer, and may have a refractive index less than that of the first refractive layer. Accordingly, light emitted from the light emitting element may be reflected or refracted while passing through the first refractive layer and the second refractive layer. Accordingly, the light may be emitted to the front of the display device, and the light efficiency of the display device may be improved.

In addition, the first refractive layer may be substantially simultaneously formed with the overcoat layer formed in the boundary area. Accordingly, an additional process for forming the first refractive layer may not be required, and a cost and a time of providing the display device may be reduced.

In addition, the display device may further include the touch sensing layer for sensing an input from the outside. The touch sensing layer may include at least one touch insulating layer and at least one touch electrode layer. The touch insulating layer may be between the first refractive layer and the second refractive layer, and may have a refractive index greater than that of the first refractive layer. The touch insulating layer may include an inorganic material, and may cover the first refractive layer. Accordingly, the first refractive layer and the second refractive layer including the organic insulating material may not contact each other. Accordingly, the first refractive layer and the second refractive layer may not be mixed with each other, and a chemical resistance of the first refractive layer and the second refractive layer may be improved. In addition, since a trapezoidal cross-sectional shape of the first refractive layer may be maintained, a taper angle of the first refractive layer may be maintained. Accordingly, the light efficiency of the display device may be improved.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the invention.

DETAILED DESCRIPTION

Figure 1:
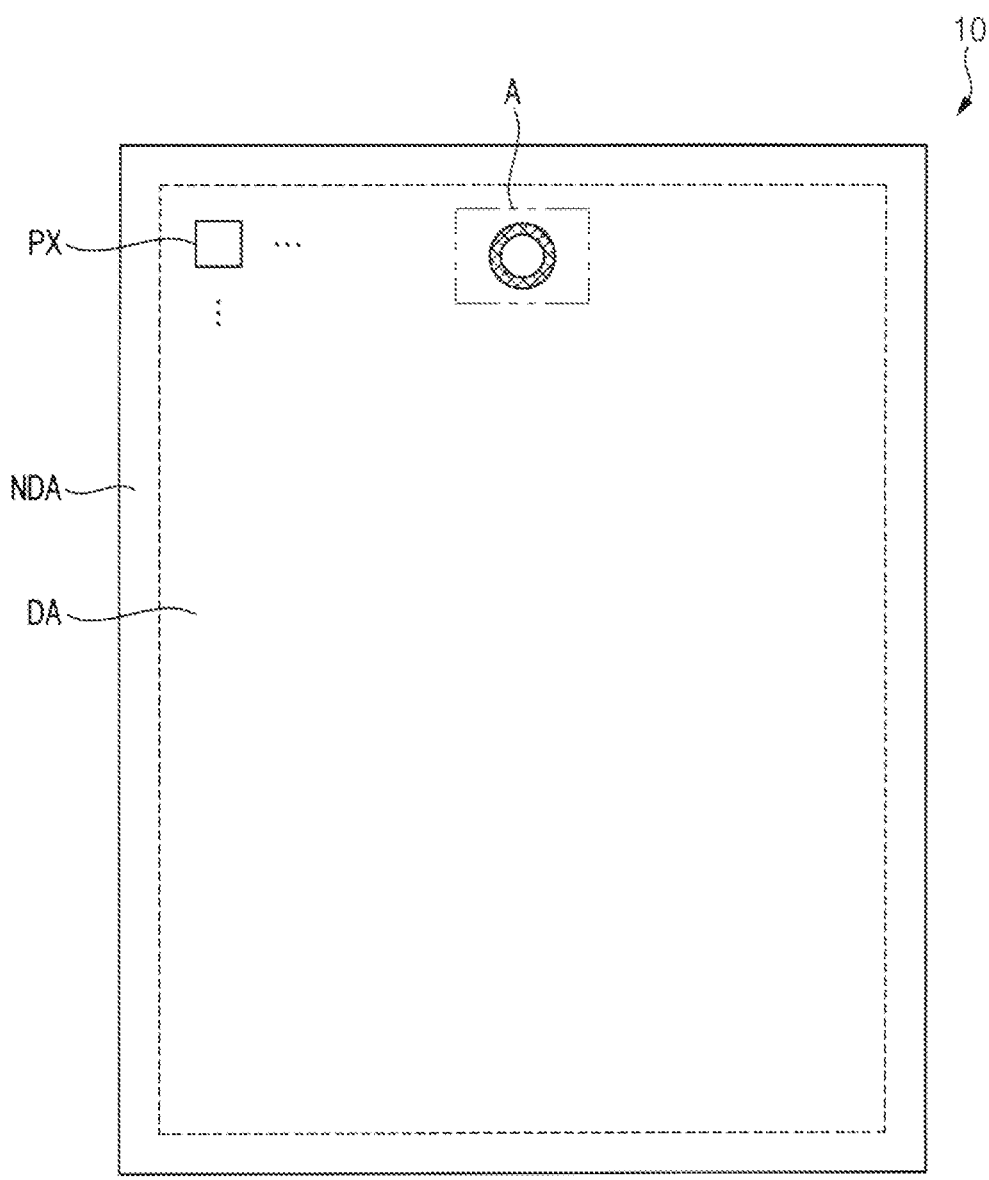
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, a reference number may indicate a singular element or a plurality of the element. For example, a reference number labeling a singular form of an element within the drawing figures may be used to reference a plurality of the singular element within the text of specification.

As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Illustrative, non-limiting embodiments will be more clearly understood from the following detailed description in conjunction with the accompanying drawings.

Figure 2:
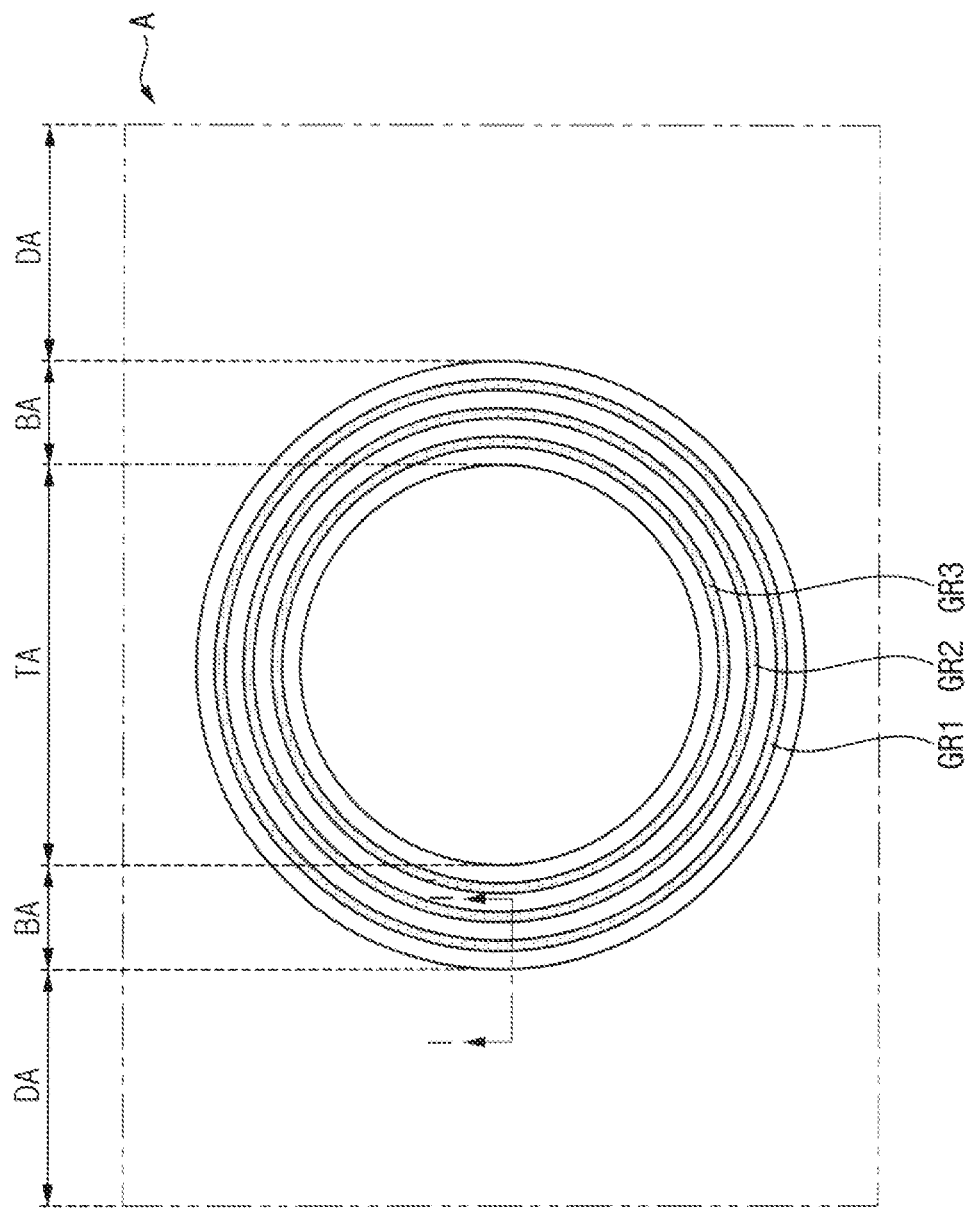
FIG. 2 is an enlarged plan view illustrating an area 'A' of FIG. 1.

FIG. 1 is a plan view illustrating a display device 10 according to an embodiment. FIG. 2 is an enlarged plan view illustrating an area 'A' of FIG. 1.

Referring to FIGS. 1 and 2, a display device 10 (or a substrate 100 included in the display device 10) according to an embodiment may include a display area DA, a non-display area NDA, a transmission area TA, and a boundary area BA. That is, various components or layers of the display device 10 may include a display area DA, a non-display area NDA, a transmission area TA, and a boundary area BA corresponding to those described for the display device 10. These areas may be arranged along a plane of the display device 10 and/or components or layers thereof, which is defined by a first direction and a second direction which cross each other. A thickness direction of the display device 10 and/or various components or layers thereof may be defined along a third direction crossing each of the first direction and the second direction.

An image may be displayed in the display area DA. A pixel PX provided in plural including a plurality of pixels PX may be disposed in the display area DA. Each of the pixels PX may include at least one thin film transistor TR and a light emitting element LED. The thin film transistor TR may generate a driving current (e.g., electrical driving current) and provide the generated driving current to the light emitting element LED. The light emitting element LED may emit light based on the driving current. In an embodiment, for example, the light emitting element LED may include an organic light emitting diode, an inorganic light emitting diode, a quantum dot light emitting diode, or the like. Light emitted from each of the pixels PX may be combined to generate the image.

The non-display area NDA may be positioned adjacent to or around the display area DA. In an embodiment, for example, the non-display area NDA may surround the display area DA in a plan view. A driver providing a driving signal to the display area DA, may be disposed in the non-display area NDA. The driving signal may include various electrical signals for driving the pixels PX such as driving voltage, a gate signal, a data signal, or the like.

The transmission area TA may be positioned inside the display area DA. In an embodiment, the transmission area TA may have a circular shape in a plan view (e.g., circular planar shape). However, embodiments are not limited thereto. In an embodiment, the transmission area TA may have another planar shape such as a polygonal shape, an elliptical shape, or the like in a plan view.

The transmission area TA may transmit external light incident on (or to) the display device 10 (e.g., light transmission area). A functional module, such as a camera module, a sensor module, or the like which provides a function to the display device 10, may be disposed on a lower surface of the display device 10. The functional module may detect or recognize an object, or the like positioned over an upper surface of the display device 10, with the light provided through the transmission area TA.

The boundary area BA may be positioned between the display area DA and the transmission area TA. The transmission area TA, the boundary area BA and the display area DA may be in order, in a plan view. In an embodiment, the boundary area BA may surround the transmission area TA in a plan view, and the display area DA may surround the boundary area BA in a plan view. In an embodiment, the boundary area BA may have a circular ring shape in a plan view. A total planar area of the display area DA may include a planar area of the transmission area TA and a planar area of the boundary area BA.

Figure 3:
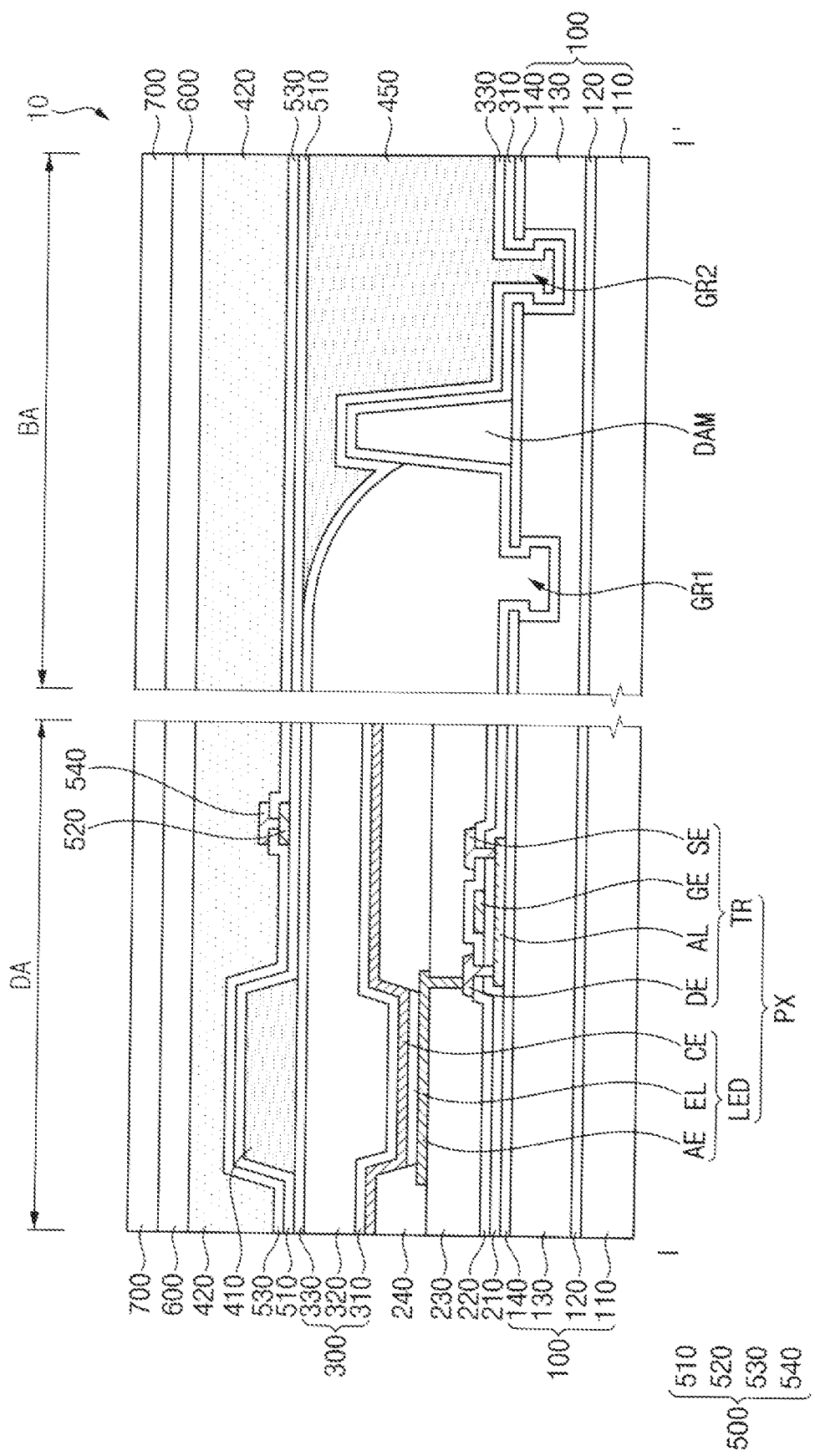
FIG. 3 is a cross-sectional view taken along line I-I' of FIG. 2.

FIG. 3 is a cross-sectional view taken along line I-I' of FIG. 2.

Referring to FIGS. 1 to 3, in an embodiment, the display device 10 may include a substrate 100, the pixels PX, a dam DAM, an encapsulation layer 300, a first refractive layer 410, a second refractive layer 420, an overcoat layer 450, a touch sensing layer 500, a polarization layer 600, and a window 700. Each of the pixels PX may include the thin film transistor TR and the light emitting element LED. The encapsulation layer 300 may include a first inorganic encapsulation layer 310, an organic encapsulation layer 320, and a second inorganic encapsulation layer 330.

The substrate 100 may include the display area DA, the non-display area NDA, the transmission area TA, and the boundary area BA. In an embodiment, the substrate 100 may have a flexible property and an insulating property. The substrate 100 may include a first resin layer 110, a first barrier layer 120, a second resin layer 130, and a second barrier layer 140.

The first resin layer 110 may include a polymer resin. Examples of the polymer resin may include polyimide (PI), polyethersulphone (PES), polyacrylate (PA), polyetherimide (PEI), polyethylene naphthalate (PEN), polyethylene terephthalate (PET), polyphenylene sulfide (PPS), polyarylate (PAR), polycarbonate (PC), cellulose acetate propionate (CAP), or the like. These can be used alone or in a combination thereof.

The first barrier layer 120 may be disposed on the first resin layer 110. The first barrier layer 120 may be disposed between the first resin layer 110 and the second resin layer 130. The first barrier layer 120 may include an inorganic insulating material. Accordingly, the first barrier layer 120 may prevent or reduce instances of impurities diffusing into the second resin layer 130 through the first resin layer 110 from outside thereof (e.g., from a lower portion of the first resin layer 110). Examples of the inorganic insulating material may include silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), titanium oxide (TiO), or the like. These can be used alone or in a combination thereof.

The second resin layer 130 may be disposed on the first barrier layer 120. The second resin layer 130 may include a polymer resin. In an embodiment, for example, the second resin layer 130 may include substantially the same material as the first resin layer 110.

The second barrier layer 140 may be disposed on the second resin layer 130. The second barrier layer 140 may include an inorganic insulating material.

In an embodiment, a groove may be provided in plural including a plurality of grooves that surrounds the transmission area TA in a plan view, may be defined in the boundary area BA of the substrate 100. In an embodiment, for example, the grooves may be defined open at an upper portion of the second resin layer 130 and at the second barrier layer 140. When a common layer (e.g., a cathode electrode CE, etc.) disposed in an entirety of the display area DA and the boundary area BA on the substrate 100, impurities such as moisture may flow into the display area DA from an end portion of the boundary area BA through the common layer, so that a characteristics of the light emitting element LED may be decreased. When the grooves are formed (or provided) in the boundary area BA of the substrate 100, the common layer may be separated (or disconnected) by the grooves, and thus flow of impurities through the common layer may be prevented or reduced.

The grooves extend into and expose surfaces of the various layers of the substrate 100, to increase an exposed surface area of the substrate 100. In addition, since a surface area of the substrate 100 increases when the grooves are formed in the boundary area BA of the substrate 100, an adhesive force between the first inorganic encapsulation layer 310 and the substrate 100 in the boundary area BA may increase.

In an embodiment, first to third grooves GR1, GR2, and GR3 may be defined in the boundary area BA of the substrate 100. The first to third grooves GR1, GR2, and GR3 may be sequentially disposed in a direction from the display area DA to the transmission area TA.

An active layer AL may be disposed in the display area DA, on the substrate 100. The active layer AL may include an oxide semiconductor, a silicon semiconductor, an organic semiconductor, or the like. In an embodiment, for example, the oxide semiconductor may include at least one oxide of indium (In), gallium (Ga), tin (Sn), zirconium (Zr), vanadium (V), hafnium (Hf), cadmium (Cd), germanium (Ge), chromium (Cr), titanium (Ti), and zinc (Zn). The silicon semiconductor may include an amorphous silicon, a polycrystalline silicon, or the like. The active layer AL may include a source area, a drain area, and a channel area positioned between the source area and the drain area.

In an embodiment, a buffer layer may be disposed on the substrate 100 and the active layer AL. The buffer layer may be disposed between the second barrier layer 140 and the active layer AL. The buffer layer may prevent or reduce instances of impurities diffusing into the active layer AL from the substrate 100. The buffer layer may include an inorganic insulating material.

A gate insulating layer 210 may be disposed on the substrate 100. The gate insulating layer 210 may cover the active layer AL on the substrate 100. The gate insulating layer 210 may include an inorganic insulating material. In an embodiment, the gate insulating layer 210 may be disposed in the display area DA, and may not be disposed in the boundary area BA (e.g., may be excluded from the boundary area BA). In an embodiment, the gate insulating layer 210 may be disposed in an entirety of the display area DA and an entirety of the boundary area BA.

A gate electrode GE may be disposed in the display area DA on the gate insulating layer 210. The gate electrode GE may overlap the channel area of the active layer AL. The gate electrode GE may include a conductive material such as a metal, an alloy, a conductive metal nitride, a conductive metal oxide, a transparent conductive material, or the like. Examples of the conductive material may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), alloys containing aluminum, alloys containing silver, alloys containing copper, alloys containing molybdenum, aluminum nitride (AlN), tungsten nitride (WN), titanium nitride (TiN), chromium nitride (CrN), tantalum nitride (TaN), strontium ruthenium oxide (SrRuO), zinc oxide (ZnO), indium tin oxide (ITO), tin oxide (SnO), indium oxide (InO), gallium oxide (GaO), indium zinc oxide (IZO), or the like. These can be used alone or in a combination thereof. The gate electrode GE may have a single-layered structure or a multi-layered structure including a plurality of conductive layers.

An interlayer insulating layer 220 may be disposed on the gate insulating layer 210. The interlayer insulating layer 220 may cover the gate electrode GE on the gate insulating layer 210. The interlayer insulating layer 220 may include an inorganic insulating material. In an embodiment, the interlayer insulating layer 220 may be disposed in the display area DA, and may not be disposed in the boundary area BA. In an embodiment, the interlayer insulating layer 220 may be disposed in an entirety of both the display area DA and the boundary area BA.

A source electrode SE and a drain electrode DE may be disposed in the display area DA, on the interlayer insulating layer 220. The source electrode SE and the drain electrode DE may be connected to the source area and the drain area of the active layer AL, respectively. Each of the source electrode SE and the drain electrode DE may include a conductive material. The active layer AL, the gate electrode GE, the source electrode SE, and the drain electrode DE may form the thin film transistor TR.

A via insulating layer 230 may be disposed on the interlayer insulating layer 220. The via insulating layer 230 may cover the source electrode SE and the drain electrode DE on the interlayer insulating layer 220. The via insulating layer 230 may include an organic insulating material. In an embodiment, the via insulating layer 230 may be disposed in the display area DA, and may not be disposed in the boundary area BA.

An anode electrode AE (e.g., first electrode) may be disposed in the display area DA, on the via insulating layer 230. The anode electrode AE may be connected to the drain electrode DE through a contact hole formed in the via insulating layer 230. Accordingly, the anode electrode AE may be electrically connected to the thin film transistor TR. The anode electrode AE may include a conductive material.

A pixel defining layer 240 may be disposed on the via insulating layer 230. The pixel defining layer 240 may cover a portion of the anode electrode AE on the via insulating layer 230. The pixel defining layer 240 may cover a peripheral portion of the anode electrode AE, and may define a pixel opening exposing a central portion of the anode electrode AE. The pixel defining layer 240 may include an organic insulating material. In an embodiment, the pixel defining layer 240 may be disposed in the display area DA, and may not be disposed in the boundary area BA.

An emission layer EL may be disposed on the anode electrode AE. The emission layer EL may be disposed in the pixel opening of the pixel defining layer 240. In embodiments, the emission layer EL may include at least one of an organic light emitting material and a quantum dot.

In an embodiment, the organic light emitting material may include a low molecular organic compound or a high molecular organic compound. Examples of the low molecular organic compound may include copper phthalocyanine, N,N'-diphenylbenzidine, tris-(8-hydroxyquinoline)aluminum, or the like. Examples of the high molecular organic compound may include poly(3,4-ethylenedioxythiophene), polyaniline, poly-phenylenevinylene, polyfluorene, or the like. These can be used alone or in a combination thereof.

In an embodiment, the quantum dot may include a core including a Group II-VI compound, a Group III-V compound, a Group IV-VI compound, a Group IV element, and/or a Group IV compound. In an embodiment, the quantum dot may have a core-shell structure including the core and a shell surrounding the core. The shell may serve as a protection layer for preventing the core from being chemically denatured to maintain semiconductor characteristics, and may serve as a charging layer for imparting electrophoretic characteristics to the quantum dot.

A cathode electrode CE (e.g., second electrode) may be disposed on the emission layer EL. The cathode electrode CE may also be disposed on the pixel defining layer 240. The cathode electrode CE may include a conductive material. In an embodiment, the cathode electrode CE may be disposed in an entirety of both the display area DA and the boundary area BA. The anode electrode AE, the emission layer EL, and the cathode electrode CE may form the light emitting element LED. The first electrode (e.g., anode AE) may face the second electrode (e.g., cathode CE) with the emission layer EL therebetween.

The dam may be disposed in the boundary area BA on the substrate 100. The dam may prevent the organic encapsulation layer 320 of the encapsulation layer 300 from overflowing to the transmission area TA. In an embodiment, the dam may be disposed between the first groove GR1 and the second groove GR2. The dam DAM may surround the second groove GR2 in a plan view. In an embodiment, the dam DAM may have a multi-layered structure including a plurality of layers. In an embodiment, for example, the plurality of layers of the dam DAM may be substantially simultaneously formed with the via insulating layer 230, the pixel defining layer 240, and a spacer (not illustrated), respectively.

The encapsulation layer 300 may cover the light emitting element LED. The first inorganic encapsulation layer 310 may be disposed in an entirety of both the display area DA and the boundary area BA. The first inorganic encapsulation layer 310 may cover the cathode electrode CE, the first groove GR1, the dam DAM, the second groove GR2, and the third groove GR3.

The organic encapsulation layer 320 may be disposed on the first inorganic encapsulation layer 310. The organic encapsulation layer 320 may have a substantially flat upper surface furthest from the substrate 100. Accordingly, the organic encapsulation layer 320 may planarize an upper portion of the light emitting element LED.

The second inorganic encapsulation layer 330 may be disposed on the organic encapsulation layer 320. The second inorganic encapsulation layer 330 may be disposed in an entirety of both the display area DA and the boundary area BA. The second inorganic encapsulation layer 330 may cover the organic encapsulation layer 320, the dam DAM, the second groove GR2, and the third groove GR3. That is, the first inorganic encapsulation layer 310 and/or the second inorganic encapsulation layer 330 which is in the display area DA, may extend to the boundary area BA, to cover the first groove GR1, the dam DAM, the second groove GR2, and the third groove GR3

The first refractive layer 410 may be disposed in the display area DA, on the second inorganic encapsulation layer 330. The first refractive layer 410 may overlap the emission layer EL. That is, the first refractive layer 410 may overlap the pixel opening of the pixel defining layer 240. In an embodiment, the first refractive layer 410 may have a trapezoidal shape in a cross-sectional view, such as to form a refractive layer pattern. However, embodiments are not limited thereto. In an embodiment, the first refractive layer 410 may have another shape such as a semicircle, a triangle, or the like in a cross-sectional view to define the refractive layer pattern.

The first refractive layer 410 may include an organic insulating material, and may have a first refractive index. In an embodiment, for example, the first refractive index may be about 1.6 to about 1.7, but embodiments are not limited thereto. In addition, the first refractive layer 410 may have a first thickness. The first thickness may be about 1.5 micrometers (μm) to about 3 μm, but embodiments are not limited thereto.

The overcoat layer 450 may be disposed in the boundary area BA, on the second inorganic encapsulation layer 330. The overcoat layer 450 may fill the second groove GR2 and the third groove GR3. When the organic encapsulation layer 320 does not fill the first groove GR1, the overcoat layer 450 may further fill the first groove GR1. The overcoat layer 450 may have a substantially flat upper surface.

The overcoat layer 450 may include an organic insulating material. The overcoat layer 450 may include substantially the same material as the first refractive layer 410. That is, the overcoat layer 450 may be substantially simultaneously formed with the first refractive layer 410. In an embodiment, for example, an organic insulating material may be applied to an entirety of both the display area DA and the boundary area BA, on the second inorganic encapsulation layer 330 to form an organic layer 400', and the first refractive layer 410 and the overcoat layer 450 may be substantially simultaneously formed as patterns of the organic insulating material, by patterning the organic layer 400'. Accordingly, an additional process for forming the first refractive layer 410 may not be required.

In an embodiment, a lower surface of the first refractive layer 410 and a lower surface of the overcoat layer 450 which are closest to the substrate 100, may directly contact an upper surface of the second inorganic encapsulation layer 330. As being in contact, elements may form an interface therebetween, without being limited thereto.

The touch sensing layer 500 may be disposed on the encapsulation layer 300. In an embodiment, the touch sensing layer 500 may include a first touch insulating layer 510, a first touch electrode layer 520, a second touch insulating layer 530, and a second touch electrode layer 540.

The first touch insulating layer 510 may be disposed on the second inorganic encapsulation layer 330. The first touch insulating layer 510 may include an inorganic insulating material. In an embodiment, the first touch insulating layer 510 may be disposed in an entirety of both the display area DA and the boundary area BA. The first touch insulating layer 510 may overlap the first refractive layer 410 and the overcoat layer 450. The first touch insulating layer 510 may cover the first refractive layer 410 on the second inorganic encapsulation layer 330, and the overcoat layer 450. In an embodiment, for example, the first touch insulating layer 510 may directly contact an upper surface of the first refractive layer 410, a side surface of the first refractive layer 410, the upper surface of the second inorganic encapsulation layer 330, and an upper surface of the overcoat layer 450.

In an embodiment, the first touch insulating layer 510 may have a second refractive index greater than the first refractive index of the first refractive layer 410. In an embodiment, for example, the second refractive index may be about 1.65 to about 1.9, but embodiments are not limited thereto. In addition, the first touch insulating layer 510 may have a second thickness less than the first thickness of the first refractive layer 410.

The first touch electrode layer 520 may be disposed on the first touch insulating layer 510. In an embodiment, the first touch electrode layer 520 may include a conductive material.

The second touch insulating layer 530 may be disposed on the first touch insulating layer 510. The second touch insulating layer 530 may include an inorganic insulating material. In an embodiment, the second touch insulating layer 530 may be disposed in an entirety of both the display area DA and the boundary area BA. The second touch insulating layer 530 may overlap the first refractive layer 410, the first touch electrode layer 520, and the overcoat layer 450. The second touch insulating layer 530 may cover the first touch electrode layer 520 on the first touch insulating layer 510. In an embodiment, for example, the second touch insulating layer 530 may directly contact an upper surface of the first touch insulating layer 510 and an upper surface of the first touch electrode layer 520.

In an embodiment, the second touch insulating layer 530 may have a third refractive index greater than the first refractive index of the first refractive layer 410. In an embodiment, for example, the third refractive index may be about 1.65 to about 1.9, but embodiments are not limited thereto. In addition, the second touch insulating layer 530 may have a third thickness less than the first thickness of the first refractive layer 410.

In an embodiment, the third refractive index of the second touch insulating layer 530 may be greater than the second refractive index of the first touch insulating layer 510. In an embodiment, the third refractive index may be less than or equal to the second refractive index.

The second touch electrode layer 540 may be disposed on the second touch insulating layer 530. The second touch electrode layer 540 may include a conductive material. The second touch electrode layer 540 may be electrically connected to the first touch electrode layer 520 through a contact hole formed in the second touch insulating layer 530.

The first touch electrode layer 520 and the second touch electrode layer 540 may form a touch electrode. The touch electrode may have a mesh structure in a plan view, but embodiments are not limited thereto.

The second refractive layer 420 may be disposed on the second touch insulating layer 530. That is, the second refractive layer 420 may be disposed on the first refractive layer 410. The first touch insulating layer 510 may be disposed between the first refractive layer 410 and the second refractive layer 420 and between the overcoat layer 450 and the second refractive layer 420. The second touch insulating layer 530 may be disposed between the first touch insulating layer 510 and the second refractive layer 420.

In an embodiment, the second refractive layer 420 may be disposed in an entirety of both the display area DA and the boundary area BA. The second refractive layer 420 may overlap the first refractive layer 410, the first touch electrode layer 520, the second touch electrode layer 540, and the overcoat layer 450. The second refractive layer 420 may cover the second touch electrode layer 540 on the second touch insulating layer 530. In an embodiment, for example, the second refractive layer 420 may directly contact an upper surface of the second touch insulating layer 530 and an upper surface of the second touch electrode layer 540.

The second refractive layer 420 may include an organic insulating material, and may have a fourth refractive index less than the first refractive index. That is, the fourth refractive index may be less than each of the second refractive index and the third refractive index. In an embodiment, for example, the fourth refractive index may be about 1.4 to about 1.6, but embodiments are not limited thereto. In addition, the second refractive layer 420 may have a fourth thickness. The fourth thickness may be sufficient to compensate for a step difference caused by the first refractive layer 410. The fourth thickness may be greater than each of the first thickness, the second thickness, and the third thickness. The fourth thickness may be greater than a sum of the first thickness, the second thickness, and the third thickness. The fourth thickness may be about 3 μm to about 10 μm, but embodiments are not limited thereto.

In an embodiment, the polarization layer 600 may be disposed on the second refractive layer 420. In an embodiment, the polarization layer 600 may be disposed in an entirety of both the display area DA and the boundary area BA. The polarization layer 600 may polarize light. Accordingly, the polarization layer 600 may suppress reflection of external light, thereby improving an optical efficiency of the display device 10.

In an embodiment, the polarization layer 600 may be omitted. In this case, the display device 10 may further include a color filter layer disposed on the second refractive layer 420. In an embodiment, for example, the color filter layer may include at least one of a red color filter, a green color filter, a blue color filter, and a black matrix.

The window 700 may be disposed on the polarization layer 600. The window 700 may have a flexible property and transparent property. The window 700 may protect the display device 10 from external force. The window 700 may cover an entirety of each of the display area DA, the non-display area NDA, the boundary area BA, and the transmission area TA.

In embodiments, the display device 10 may include the first refractive layer 410 and the second refractive layer 420. The first refractive layer 410 may be disposed on the light emitting element LED and may overlap the emission layer EL (or the pixel opening of the pixel defining layer 240). The second refractive layer 420 may cover the first refractive layer 410, and may have a refractive index less than that of the first refractive layer 410. Accordingly, light emitted from the light emitting element LED may be reflected or refracted while passing in order through the first refractive layer 410 and the second refractive layer 420, along a light emitting direction from the light emitting element LED. Accordingly, the light may be emitted to the front of the display device 10, and a light efficiency of the display device 10 may be improved.

In addition, the first refractive layer 410 of the display area DA may be substantially simultaneously formed with the overcoat layer 450 formed in the boundary area BA, on the substrate 100. Accordingly, an additional process for forming the first refractive layer 410 may not be required, and a cost and a time of providing (or manufacturing) the display device 10 may be reduced.

In addition, the display device 10 may further include the touch sensing layer 500 for sensing an input from outside the display device 10. The touch sensing layer 500 may include at least one touch insulating layer and at least one touch electrode layer. The touch insulating layer may be disposed between the first refractive layer 410 and the second refractive layer 420, and may have a refractive index greater than that of the first refractive layer 410. The touch insulating layer may include an inorganic material, and may cover the first refractive layer 410. Accordingly, the first refractive layer 410 and the second refractive layer 420 including the organic insulating material may not contact each other. Accordingly, the first refractive layer 410 and the second refractive layer 420 may not be mixed with each other, and a chemical resistance of the first refractive layer 410 and the second refractive layer 420 may be improved. In addition, since a trapezoidal cross-sectional shape of the first refractive layer 410 may be maintained, a taper angle of the first refractive layer 410 may be maintained. Accordingly, the light efficiency of the display device 10 may be improved.

FIGS. 4 to 9 are cross-sectional views illustrating an embodiment of a method of providing (or manufacturing) the display device 10 of FIG. 3.

Figure 4:
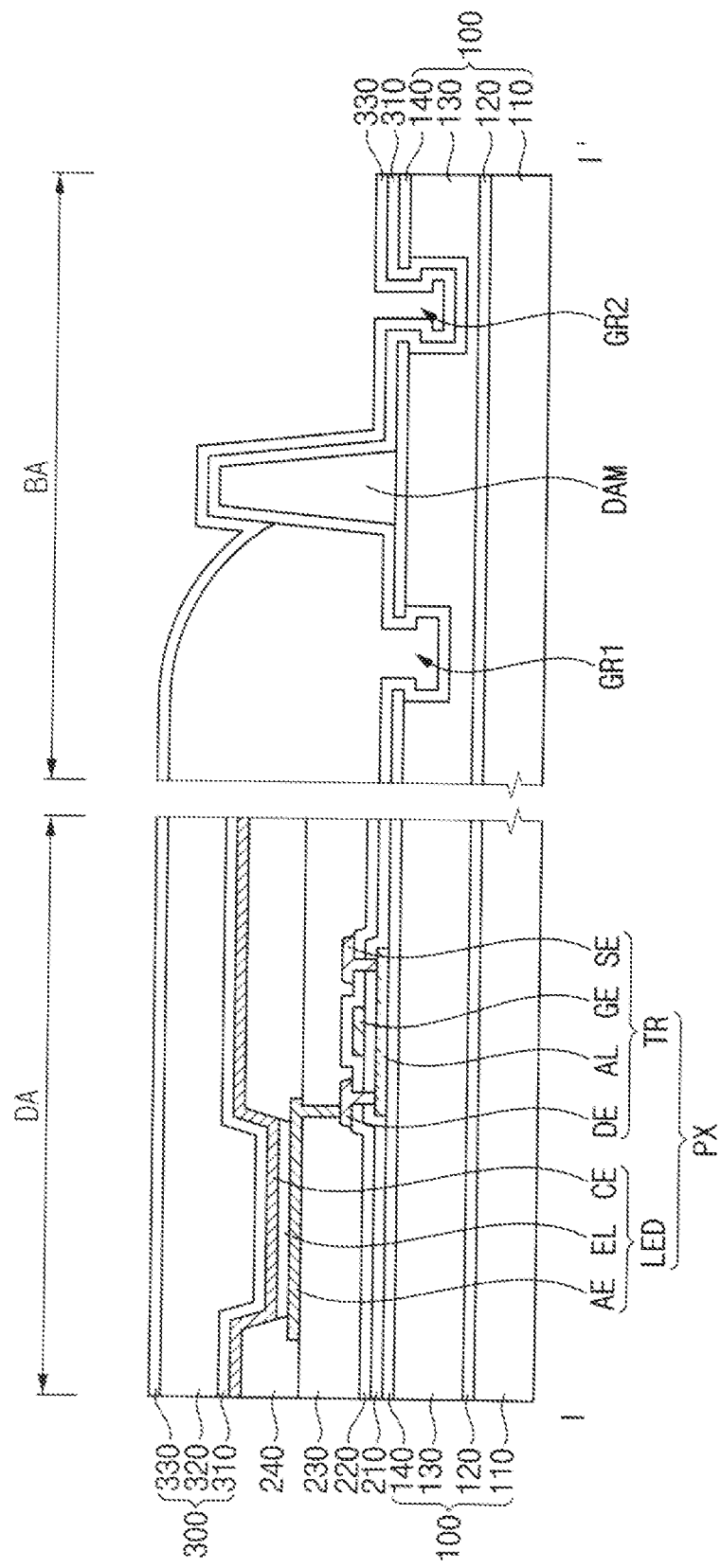
FIGS. 4 to 9 are cross-sectional views illustrating an embodiment of a method of providing the display device of FIG. 3.

Referring to FIG. 4, first, the first barrier layer 120, the second resin layer 130, and the second barrier layer 140 may be formed (or provided) on the first resin layer 110. After the second barrier layer 140 is formed, the first to third grooves GR1, GR2, and GR3 may be formed as recessed in the substrate 100. The first to third grooves GR1, GR2, and GR3 may be formed by removing a portion of the second resin layer 130 and a portion of the second barrier layer 140, by laser drilling or the like.

The thin film transistor TR, the light emitting element LED, and the insulating layers 210, 220, 230, and 240 may be formed in the display area DA, on the substrate 100, and the dam DAM may be formed in the boundary area BA, on the substrate 100. In addition, the encapsulation layer 300 covering the light emitting element LED may be formed.

The encapsulation layer 300 may include the first inorganic encapsulation layer 310, the organic encapsulation layer 320, and the second inorganic encapsulation layer 330. The first inorganic encapsulation layer 310 may be formed in an entirety of both the display area DA and the boundary area BA. The first inorganic encapsulation layer 310 may cover the light emitting element LED. The organic encapsulation layer 320 may be formed in the display area DA, on the first inorganic encapsulation layer 310. An end portion of the organic encapsulation layer 320 which is furthest from the display area DA, may extend to the dam DAM disposed in the boundary area BA. The second inorganic encapsulation layer 330 may be formed in an entirety of both the display area DA and the boundary area BA. The second inorganic encapsulation layer 330 may cover the organic encapsulation layer 320, the dam DAM, the second groove GR2, and the third groove GR3.

Figure 5:
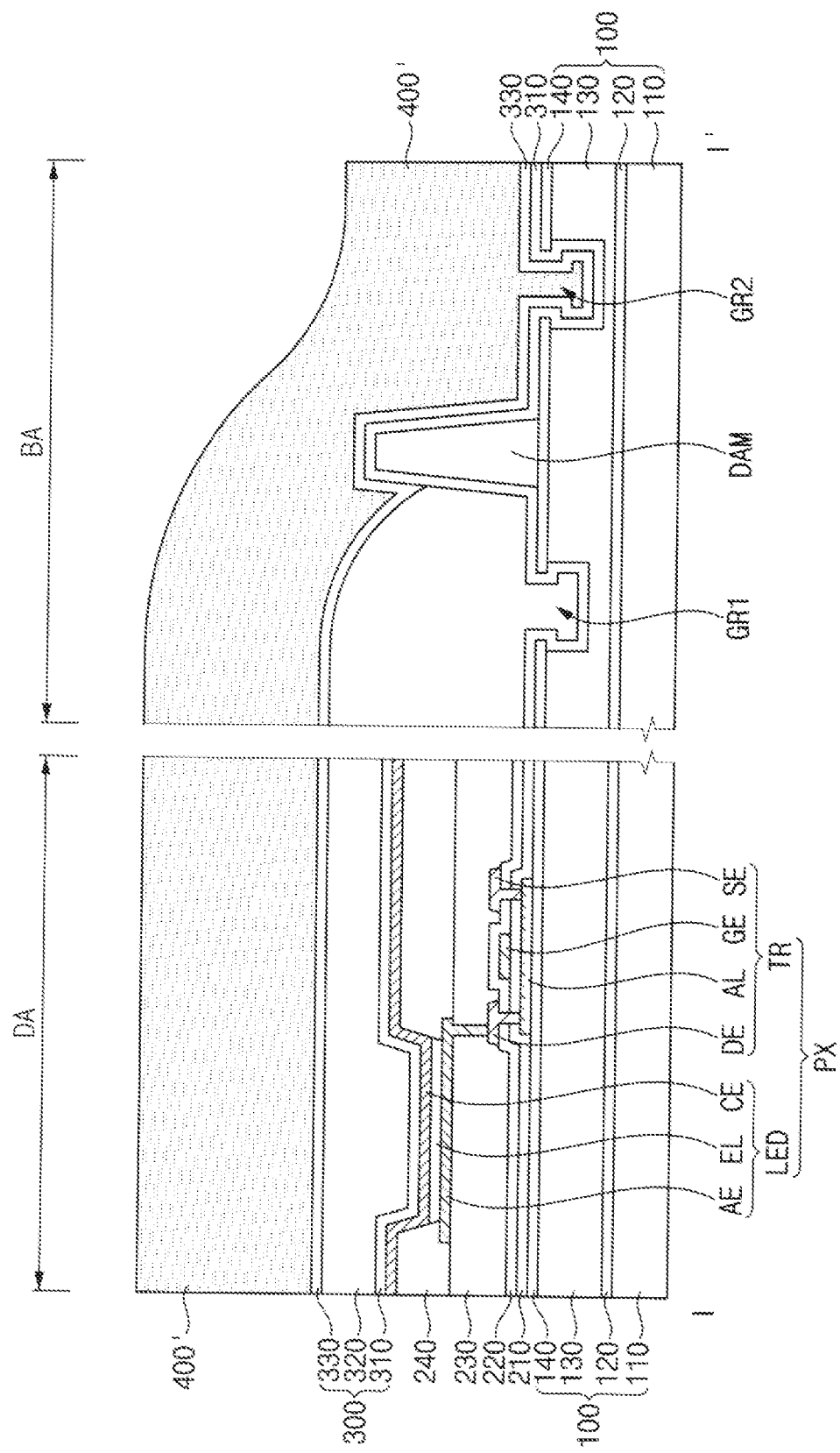

Referring to FIG. 5, an organic insulating material may be applied to an entirety of both the display area DA and the boundary area BA on the second inorganic encapsulation layer 330 to form the organic layer 400'. The organic insulating material may have the first refractive index. The organic layer 400' may be formed to have a sufficient thickness to compensate for a step difference between layers in the display area DA and layers in the boundary area BA, especially at a boundary between the areas. The organic layer 400' may be formed on the upper surface of the second inorganic encapsulation layer 330.

Figure 6:
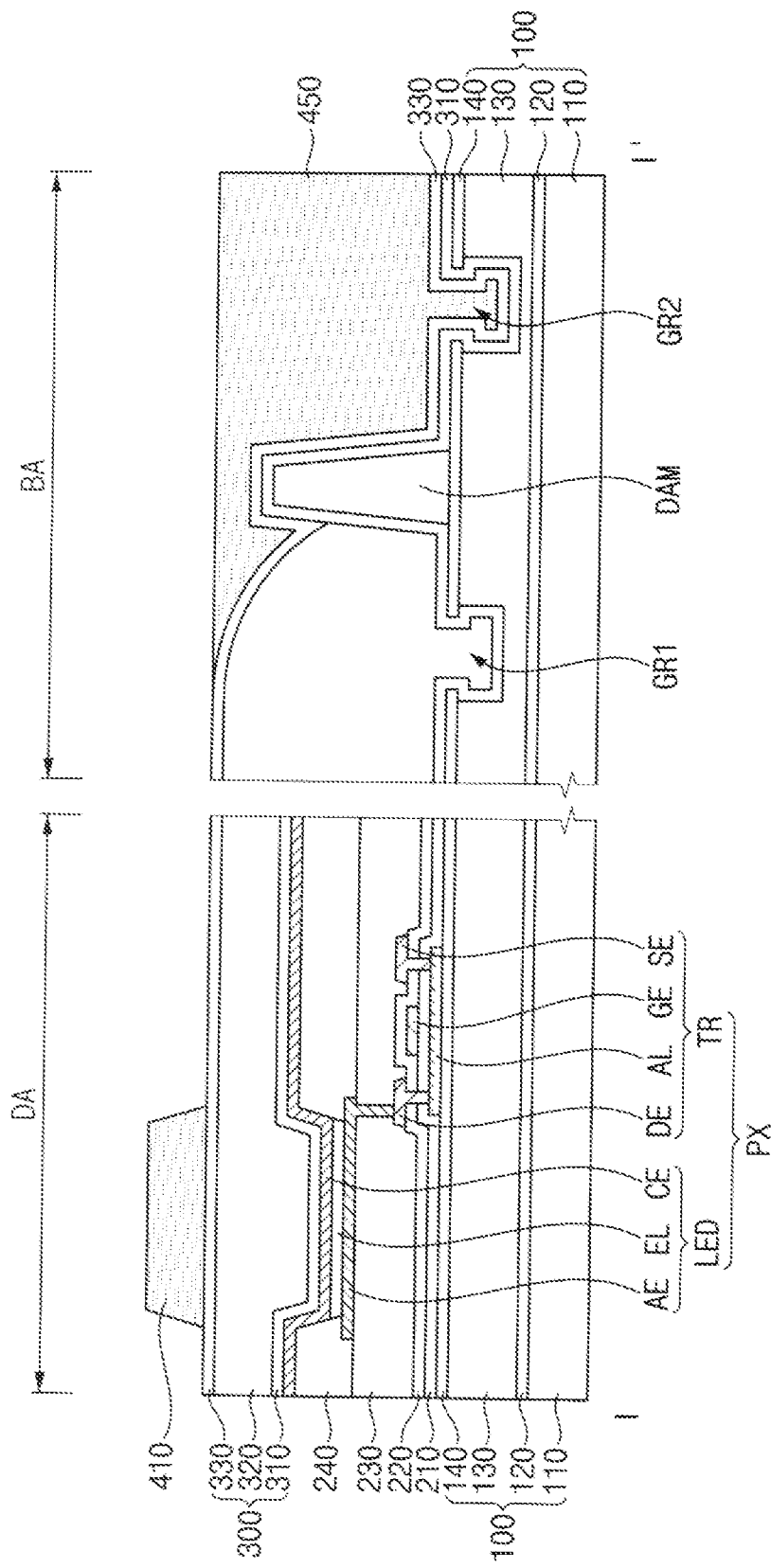

Referring to FIGS. 5 and 6, the first refractive layer 410 and the overcoat layer 450 may be substantially simultaneously formed as respective refractive patterns, by patterning of the organic layer 400'. In an embodiment, the organic layer 400' may be patterned by a photolithography process.

In an embodiment, the organic layer 400' may be patterned by a photolithography process using a halftone mask. In an embodiment, for example, a thickness of the first refractive layer 410 to be formed and a thickness of the overcoat layer 450 to be formed may be different from each other. In an embodiment, for example, the thickness of the overcoat layer 450 for compensating for the step difference between the display area DA and the boundary area BA may be greater than the thickness of the first refractive layer 410. Accordingly, the first refractive layer 410 and the overcoat layer 450 having different thicknesses may be formed at once (e.g., a same time) by the photolithography process using the halftone mask. In an embodiment, for example, the halftone mask may include a light blocking part, a transmission part, and a semi-transmission part. The halftone mask may be placed to be spaced apart from an upper portion of the organic layer 400' such that the semi-transmission part overlaps the emission layer EL (or the pixel opening of the pixel defining layer 240), and the photolithography process may be performed by irradiating light through the halftone mask.

Figure 7:
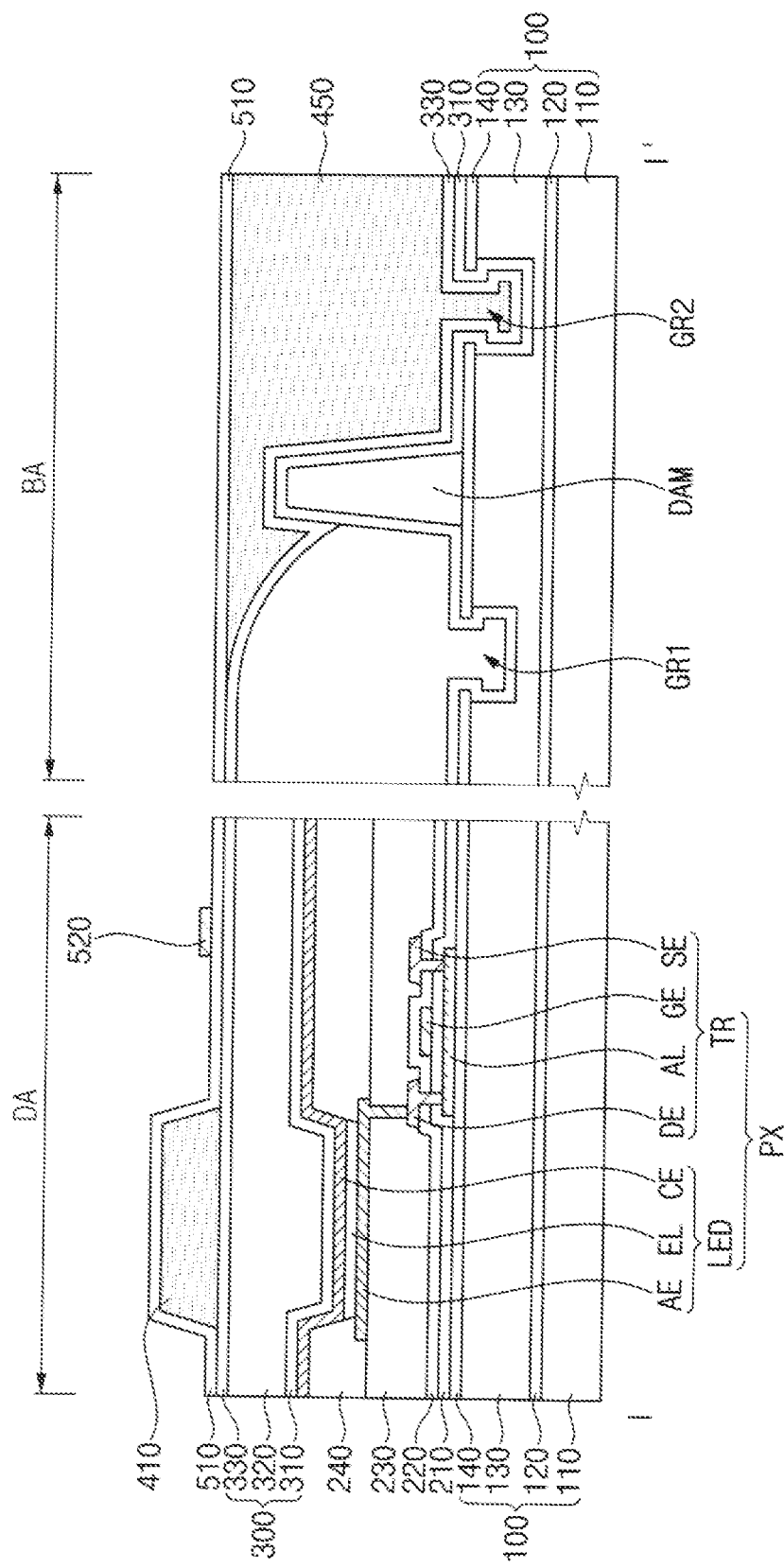

Referring to FIG. 7, the first touch insulating layer 510 may be formed by depositing an inorganic insulating material, on the second inorganic encapsulation layer 330. The inorganic insulating material may have the second refractive index.

In an embodiment, the first touch insulating layer 510 may be formed in an entirety of both the display area DA and the boundary area BA. The first touch insulating layer 510 may overlap the first refractive layer 410 and the overcoat layer 450. The first touch insulating layer 510 may cover the first refractive layer 410 on the second inorganic encapsulation layer 330 and the overcoat layer 450. In an embodiment, for example, the first touch insulating layer 510 may directly contact the upper surface of the first refractive layer 410, the side surface of the first refractive layer 410, the upper surface of the second inorganic encapsulation layer 330, and the upper surface of the overcoat layer 450.

The first touch electrode layer 520 may be formed on the first touch insulating layer 510. In an embodiment, for example, a conductive layer may be formed by depositing a conductive material on the first touch insulating layer 510, and the first touch electrode layer 520 may be formed by patterning the conductive layer.

Figure 8:
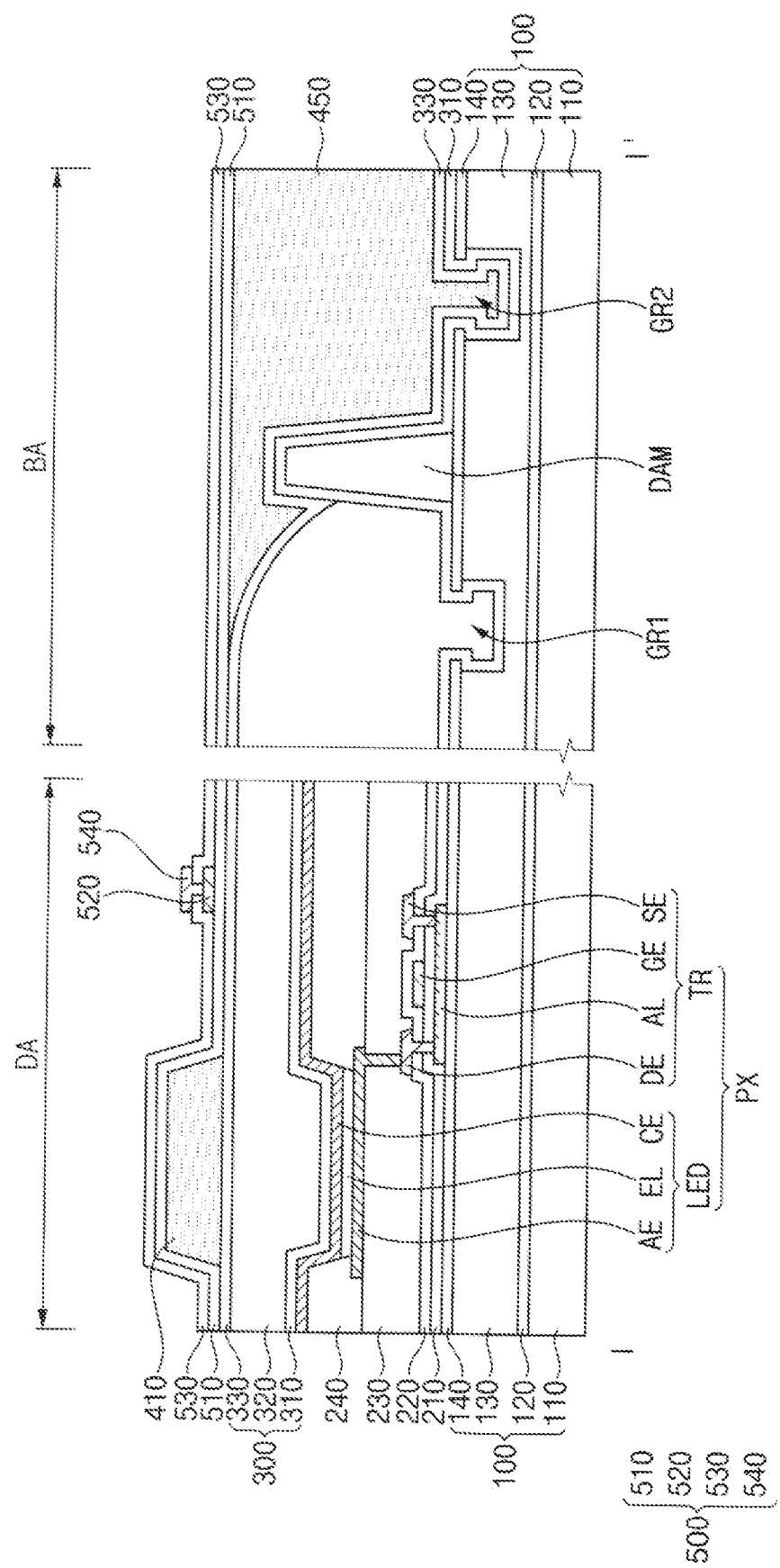

Referring to FIG. 8, the second touch insulating layer 530 may be formed by depositing an inorganic insulating material on the first touch insulating layer 510. The inorganic insulating material may have the third refractive index.

In an embodiment, the second touch insulating layer 530 may be formed in an entirety of both the display area DA and the boundary area BA. The second touch insulating layer 530 may overlap the first refractive layer 410, the first touch electrode layer 520, and the overcoat layer 450. The second touch insulating layer 530 may cover the first touch electrode layer 520 on the first touch insulating layer 510. In an embodiment, for example, the second touch insulating layer 530 may directly contact the upper surface of the first touch insulating layer 510 and the upper surface of the first touch electrode layer 520.

A contact hole may be formed in the second touch insulating layer 530 to overlap (or correspond to) the first touch electrode layer 520. The second touch electrode layer 540 may be formed on the second touch insulating layer 530 to overlap the contact hole. In an embodiment, for example, a conductive layer may be formed by depositing a conductive material on the second touch insulating layer 530, and the second touch electrode layer 540 may be formed by patterning the conductive layer.

Figure 9:
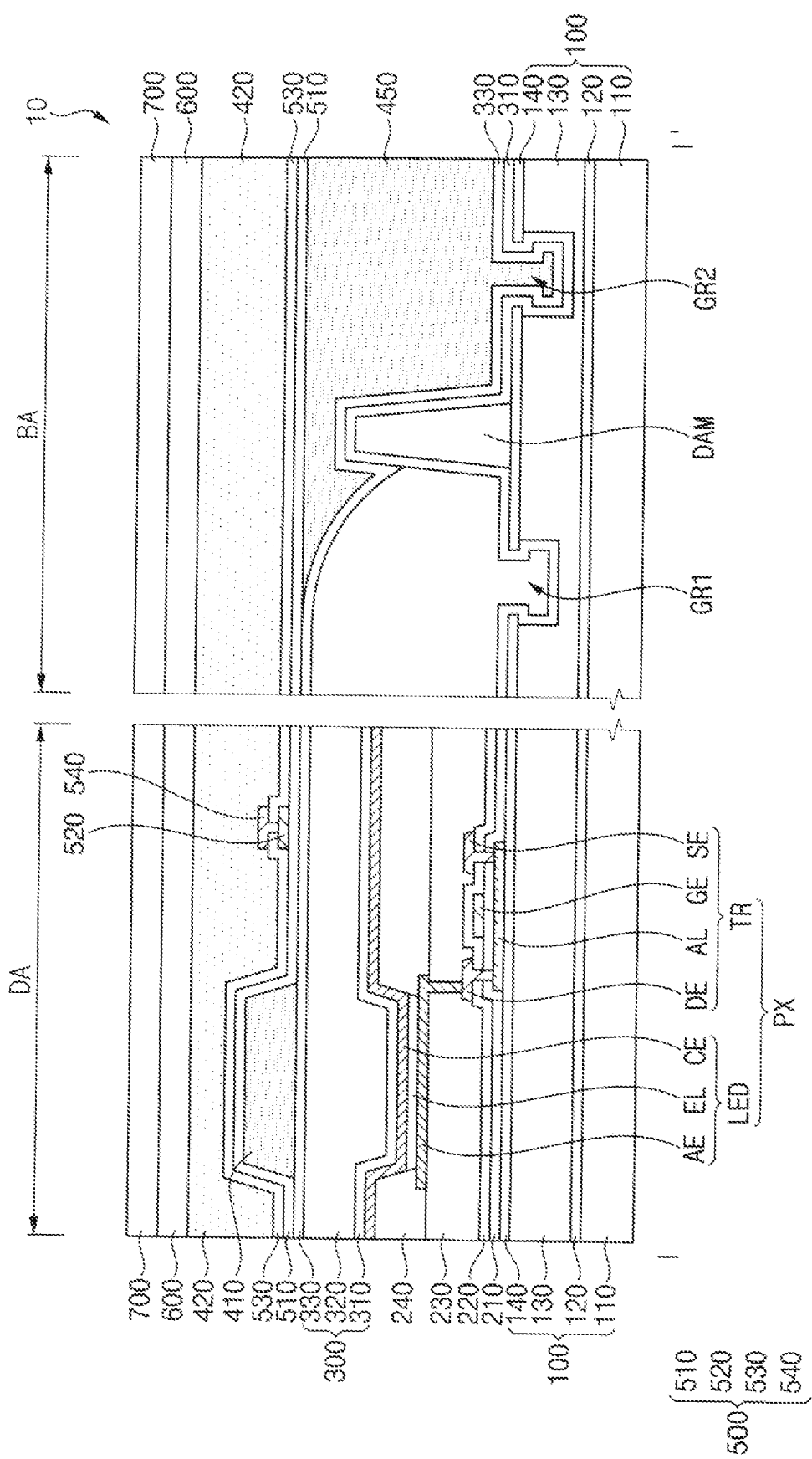

Referring to FIG. 9, the second refractive layer 420 may be formed by applying an organic insulating material on the second touch insulating layer 530. The organic insulating material may have the fourth refractive index.

In an embodiment, the second refractive layer 420 may be formed in an entirety of both in the display area DA and the boundary area BA. The second refractive layer 420 may overlap the first refractive layer 410, the first touch electrode layer 520, the second touch electrode layer 540, and the overcoat layer 450. The second refractive layer 420 may cover the second touch electrode layer 540 on the second touch insulating layer 530. In an embodiment, for example, the second refractive layer 420 may directly contact the upper surface of the second touch insulating layer 530 and the upper surface of the second touch electrode layer 540.

The polarization layer 600 and the window 700 may be formed on the second refractive layer 420 to provide the display device 10.

Figure 10:
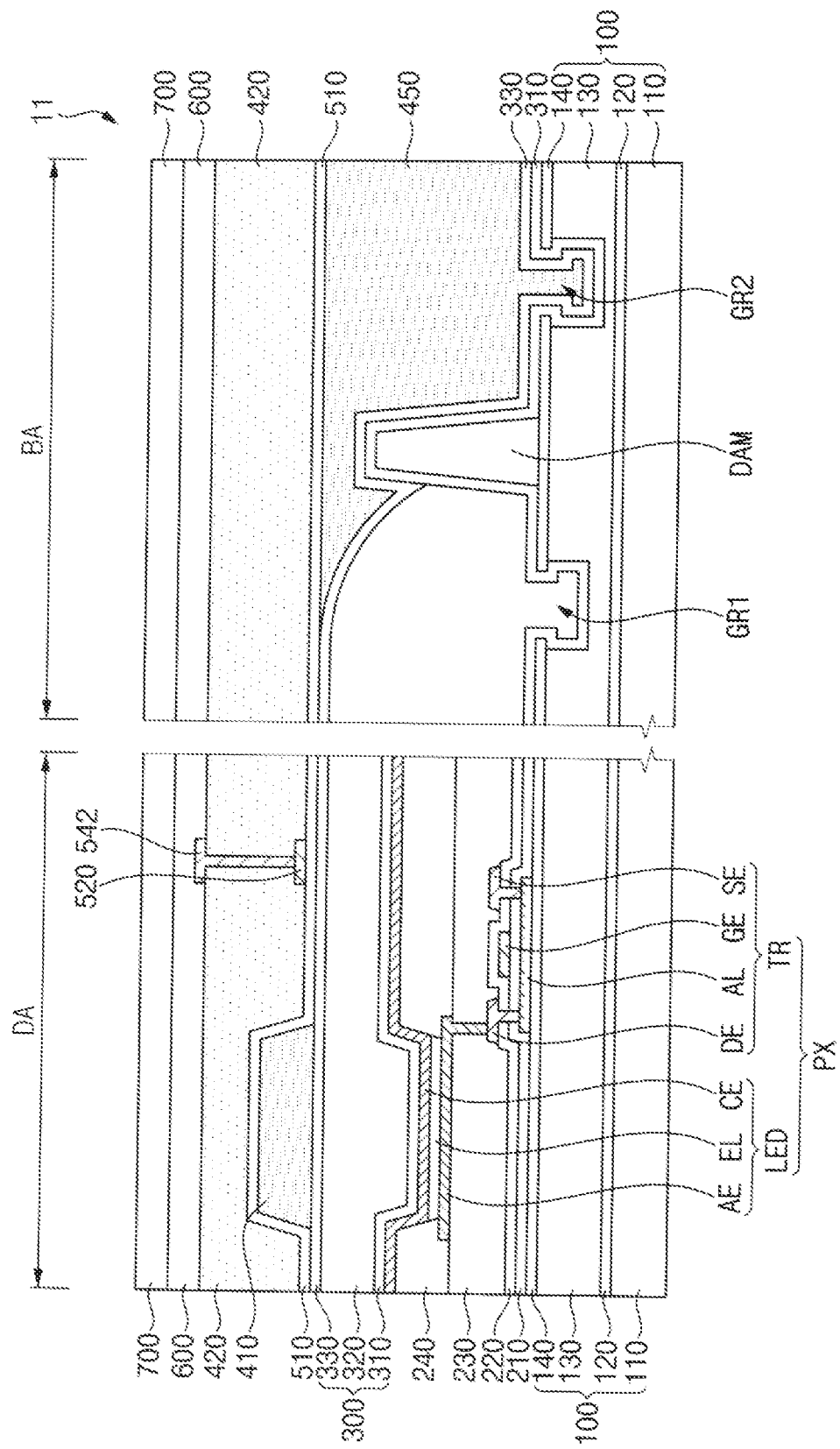
FIG. 10 is a cross-sectional view illustrating a display device according to an embodiment.

FIG. 10 is a cross-sectional view illustrating a display device 11 according to an embodiment. For example, FIG. 10 may correspond to FIG. 3 as a cross-sectional view taken along line I-I' of FIG. 2.

Referring to FIG. 10, in an embodiment, a display device 11 may include a substrate 100, a plurality of pixels PX, a dam DAM, an encapsulation layer 300, a first refractive layer 410, a second refractive layer 420, an overcoat layer 450, a first touch insulating layer 510, a first touch electrode layer 520, a second touch electrode layer 542, a polarization layer 600, and a window 700. In an embodiment, for example, the display device 11 of FIG. 10 may be substantially the same as or similar to the display device 10 of FIG. 3 except that the second touch insulating layer 530 is omitted and the second touch electrode layer 542 is disposed on the second refractive layer 420. Therefore, repeated descriptions will be omitted or simplified.

The first refractive layer 410 may be disposed in the display area DA, on the second inorganic encapsulation layer 330. The overcoat layer 450 may be disposed in the boundary area BA, on the second inorganic encapsulation layer 330. The overcoat layer 450 may include substantially the same material as the first refractive layer 410. That is, the overcoat layer 450 may be substantially simultaneously formed with the first refractive layer 410 and may be respective patterns of a same material layer.

The first refractive layer 410 may include an organic insulating material, and may have a first refractive index. In an embodiment, for example, the first refractive index may be about 1.6 to about 1.7, but embodiments are not limited thereto.

The first touch insulating layer 510 may be disposed on the second inorganic encapsulation layer 330. The first touch insulating layer 510 may include an inorganic insulating material. In an embodiment, the first touch insulating layer 510 may be disposed in an entirety of both the display area DA and the boundary area BA. The first touch insulating layer 510 may cover the first refractive layer 410 on the second inorganic encapsulation layer 330 and the overcoat layer 450. In an embodiment, for example, the first touch insulating layer 510 may directly contact an upper surface of the first refractive layer 410, a side surface of the first refractive layer 410, the upper surface of the second inorganic encapsulation layer 330, and an upper surface of the overcoat layer 450.

In an embodiment, the first touch insulating layer 510 may have a second refractive index greater than the first refractive index. In an embodiment, for example, the second refractive index may be about 1.65 to about 1.9, but embodiments are not limited thereto.

The first touch electrode layer 520 may be disposed on the first touch insulating layer 510. In an embodiment, the first touch electrode layer 520 may include a conductive material.

The second refractive layer 420 may be disposed on the first touch insulating layer 510. That is, the second refractive layer 420 may be disposed facing the first refractive layer 410 with the first touch insulating layer 510 therebetween. The first touch insulating layer 510 may be disposed between the first refractive layer 410 and the second refractive layer 420 and between the overcoat layer 450 and the second refractive layer 420.

In an embodiment, the second refractive layer 420 may be disposed in an entirety of both the display area DA and the boundary area BA. The second refractive layer 420 may cover the first touch electrode layer 520 on the first touch insulating layer 510. In an embodiment, for example, the second refractive layer 420 may directly contact an upper surface of the first touch insulating layer 510 and an upper surface of the first touch electrode layer 520.

The second refractive layer 420 may include an organic insulating material, and may have a fourth refractive index less than the first refractive index. That is, the fourth refractive index may be less than the second refractive index. In an embodiment, for example, the fourth refractive index may be about 1.4 to about 1.6, but embodiments are not limited thereto.

The second touch electrode layer 542 may be disposed on the second refractive layer 420. The second touch electrode layer 542 may include a conductive material. The second touch electrode layer 542 may be electrically connected to the first touch electrode layer 520 through a contact hole formed in the second refractive layer 420.

The polarization layer 600 may be disposed on the second refractive layer 420. In an embodiment, the polarization layer 600 may cover the second touch electrode layer 542 on the second refractive layer 420. In an embodiment, for example, the polarization layer 600 may directly contact an upper surface of the second touch electrode layer 542. In an embodiment, a protective layer may be further disposed between the polarization layer 600 and the second touch electrode layer 542.

In this embodiment, the second refractive layer 420 may be disposed between the first touch electrode layer 520 and the second touch electrode layer 542. The first touch electrode layer 520 and the second touch electrode layer 542 may be insulated from each other by the second refractive layer 420. Accordingly, an additional process for forming another insulating layer (e.g., the second touch insulating layer 530 of FIG. 3) for insulating the first touch electrode layer 520 and the second touch electrode layer 542 from each other may be omitted, so that a cost and a time of providing the display device 11 may be reduced. In addition, since the second refractive layer 420 has a sufficient thickness, parasitic capacitance induced between the first touch electrode layer 520 and the second touch electrode layer 542 may be prevented or reduced.

Figure 11:
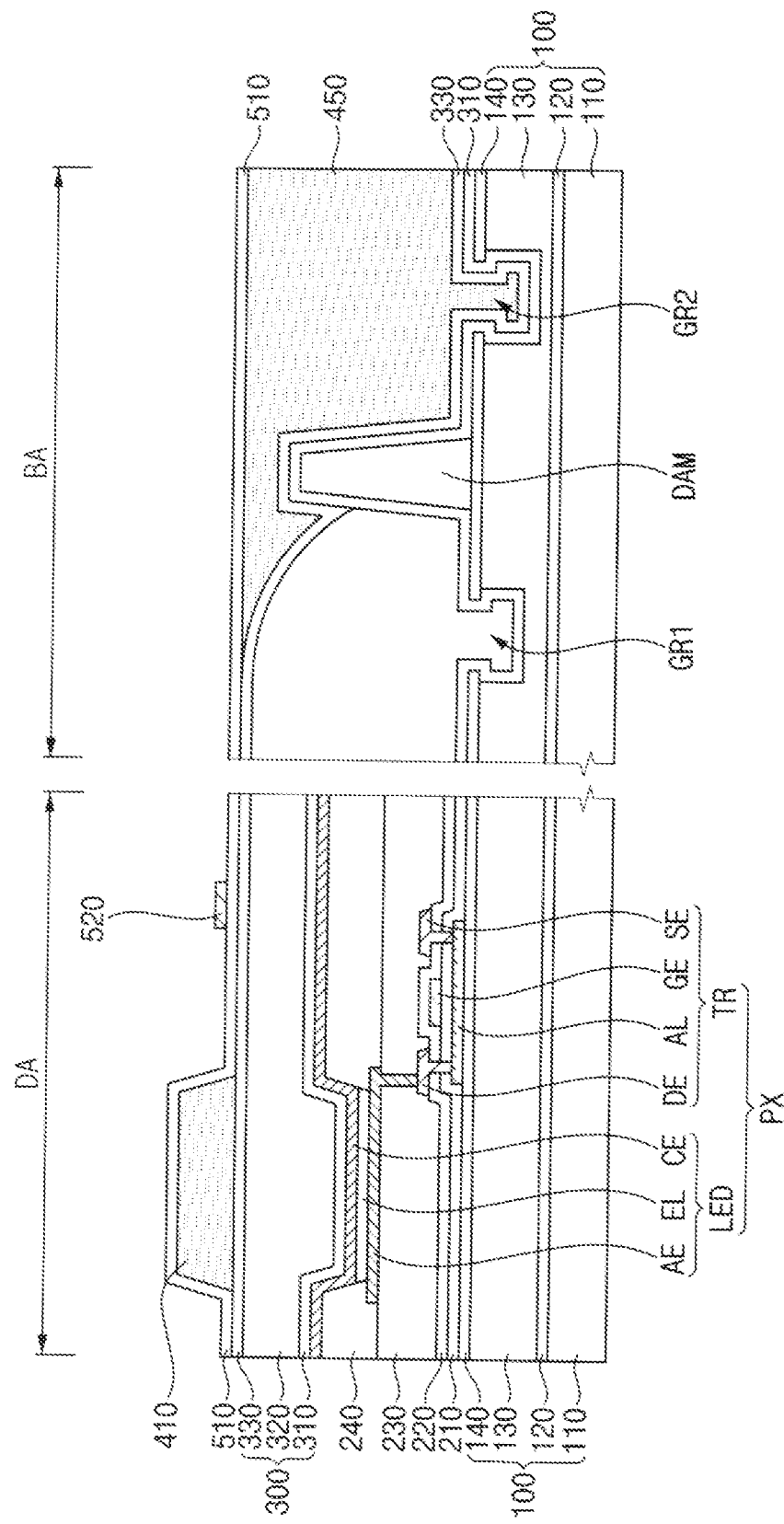
FIGS. 11 to 13 are cross-sectional views illustrating a method of providing the display device of FIG. 10.
Figure 12:
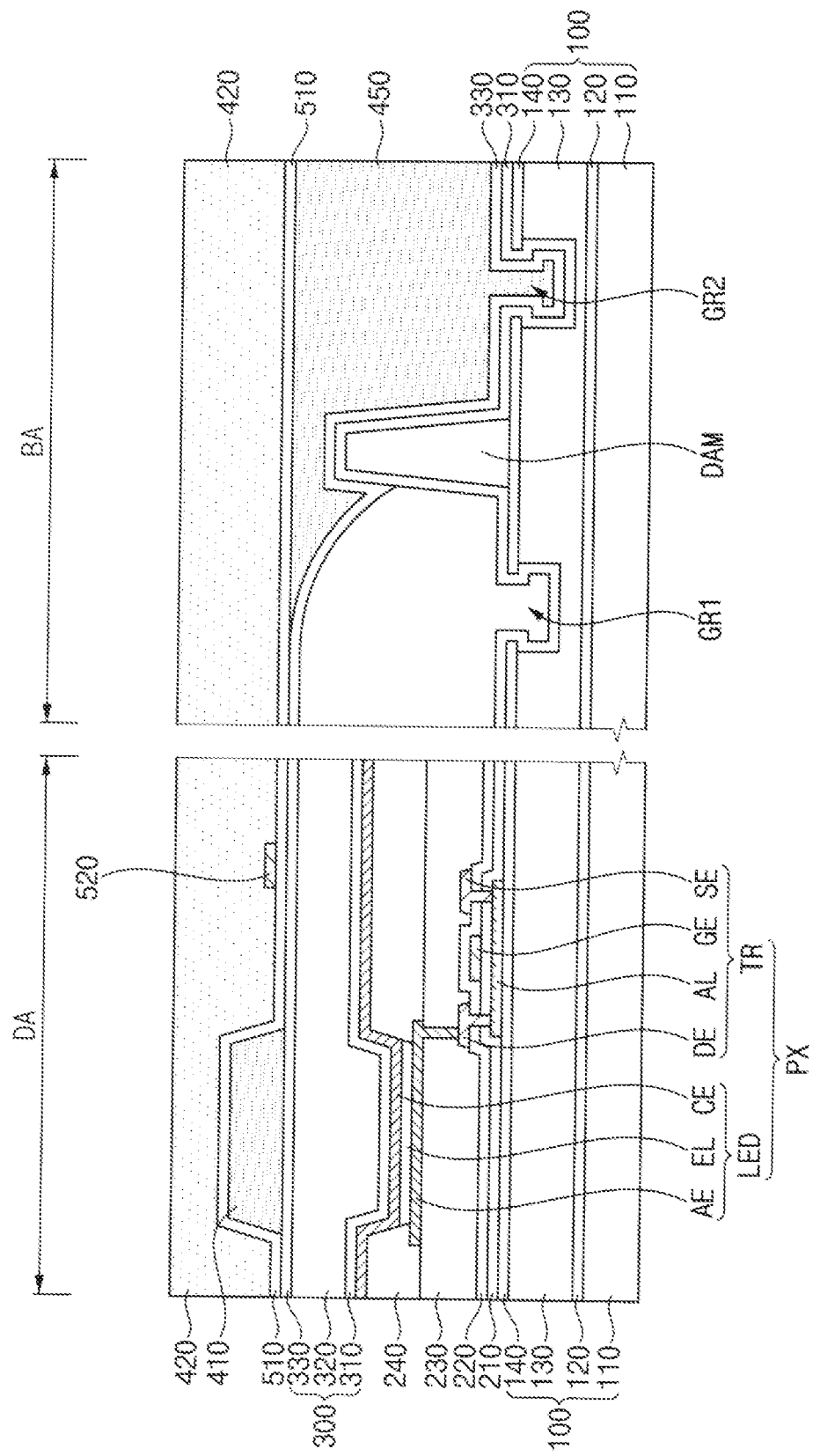
Figure 13:
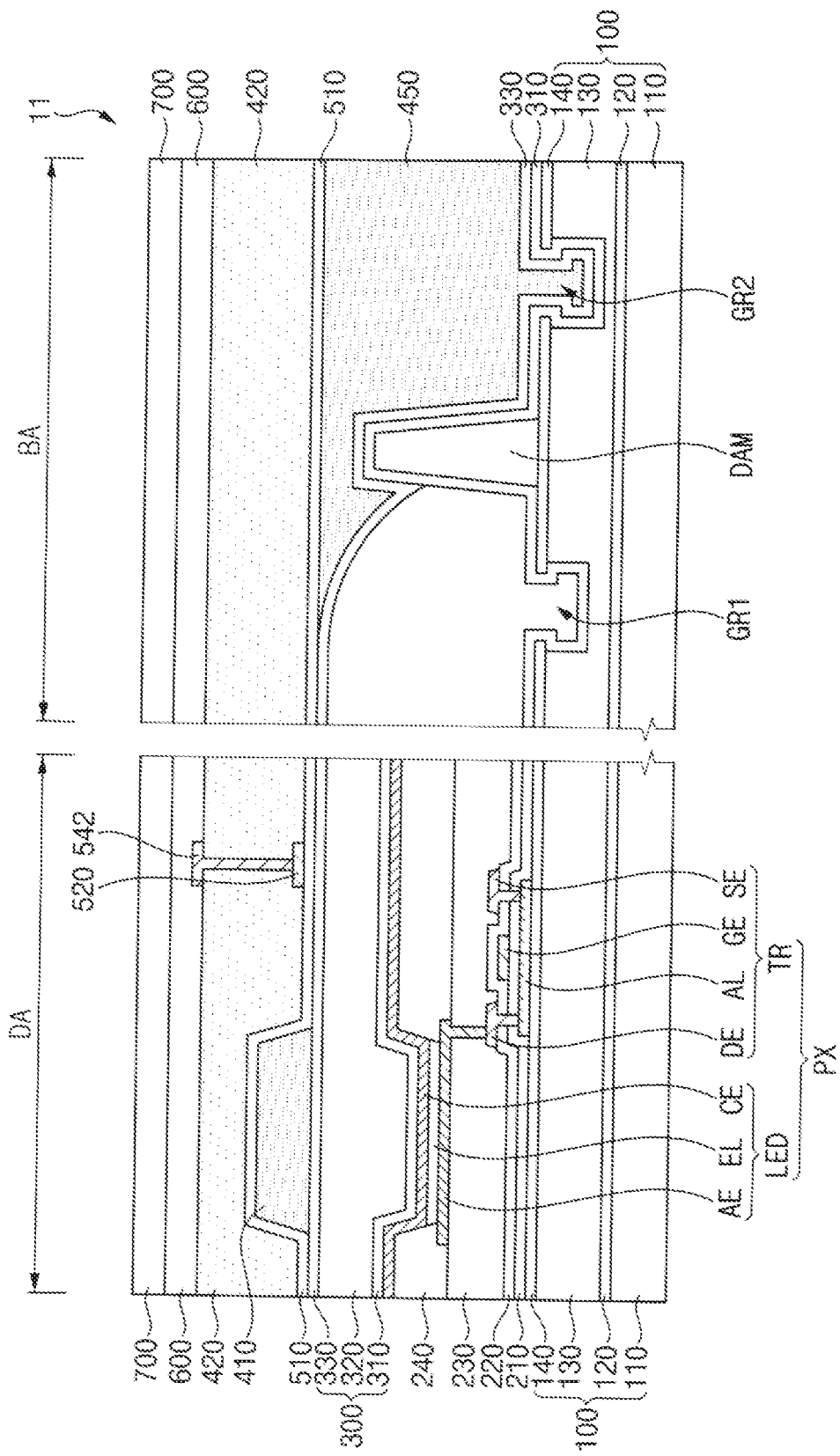

FIGS. 11 to 13 are cross-sectional views illustrating an embodiment of a method of manufacturing the display device 11 of FIG. 10.

Referring to FIG. 11, the thin film transistor TR, the light emitting element LED, the insulating layers 210, 220, 230, and 240, the encapsulation layer 300, the first refractive layer 410, the overcoat layer 450, the first touch insulating layer 510, and the first touch electrode layer 520 may be formed on the substrate 100. The thin film transistor TR, the light emitting element LED, the insulating layers 210, 220, 230, and 240, the encapsulation layer 300, the first refractive layer 410, the overcoat layer 450, the first touch insulating layer 510, and the first touch electrode layer 520 may be formed in the same manner as described with reference to FIGS. 4 to 7. Therefore, repeated descriptions will be omitted or simplified.

Referring to FIG. 12, the second refractive layer 420 may be formed by applying an organic insulating material on the first touch insulating layer 510. The organic insulating material may have the fourth refractive index. In an embodiment, the second refractive layer 420 may be formed in an entirety of both the display area DA and the boundary area BA. The second refractive layer 420 may cover the first touch electrode layer 520 on the first touch insulating layer 510. In an embodiment, for example, the second refractive layer 420 may directly contact the upper surface of the first touch insulating layer 510 and the upper surface of the first touch electrode layer 520.

Referring to FIG. 13, a contact hole may be formed in the second refractive layer 420 to overlap the first touch electrode layer 520 and expose the first touch electrode layer 520 to outside the second refractive layer 420. The second touch electrode layer 542 may be formed on the second refractive layer 420 to extend from an upper surface thereof and along a side surface thereof, to overlap the contact hole. In an embodiment, for example, a conductive layer may be formed by depositing a conductive material on the second refractive layer 420, and the second touch electrode layer 542 may be formed by patterning the conductive layer.

The polarization layer 600 and the window 700 may be formed on the second refractive layer 420.

Figure 14:
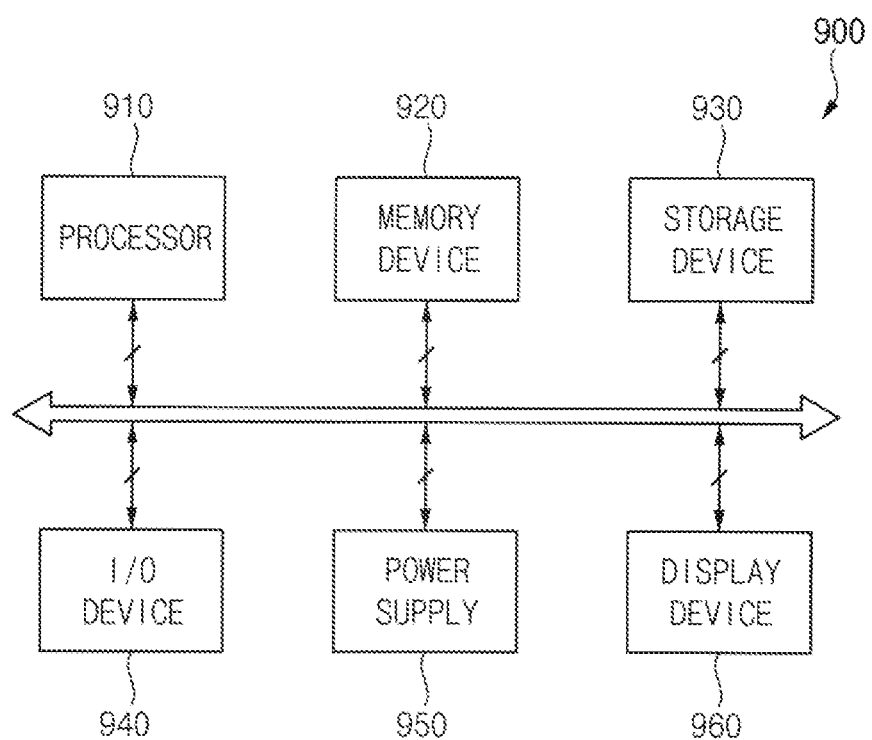
FIG. 14 is a block diagram illustrating an electronic device including a display device according to an embodiment.

FIG. 14 is a block diagram illustrating an embodiment of an electronic device 900 including a display device 960 according to one or more embodiment.

Referring to FIG. 14, in an embodiment, an electronic device 900 may include a processor 910, a memory device 920, a storage device 930, an input/output ("I/O") device 940, a power supply 950, and a display device 960. Here, the display device 960 may correspond to the display device 10 of FIG. 3 or the display device 11 of FIG. 10. The electronic device 900 may further include a plurality of ports for communicating with a video card, a sound card, a memory card, a universal serial bus ("USB") device, or the like. In an embodiment, the electronic device 900 may be implemented as a television. In an embodiment, the electronic device 900 may be implemented as a smart phone. However, embodiments are not limited thereto, in an embodiment, the electronic device 900 may be implemented as a cellular phone, a video phone, a smart pad, a smart watch, a tablet personal computer ("PC"), a car navigation system, a computer monitor, a laptop, a head disposed (e.g., mounted) display ("HMD"), or the like.

The processor 910 may perform various computing functions. In an embodiment, the processor 910 may be a microprocessor, a central processing unit ("CPU"), an application processor ("AP"), or the like. The processor 910 may be coupled to other components via an address bus, a control bus, a data bus, or the like. In an embodiment, the processor 910 may be coupled to an extended bus such as a peripheral component interconnection ("PCI") bus.

The memory device 920 may store data for operations of the electronic device 900. In an embodiment, the memory device 920 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, or the like, and/or at least one volatile memory device such as a dynamic random access memory ("DRAM") device, a static random access memory ("SRAM") device, a mobile DRAM device, or the like.

In an embodiment, the storage device 930 may include a solid state drive ("SSD") device, a hard disk drive ("HDD") device, a CD-ROM device, or the like. In an embodiment, the I/O device 940 may include an input device such as a keyboard, a keypad, a mouse device, a touchpad, a touchscreen, or the like, and an output device such as a printer, a speaker, or the like.

The power supply 950 may provide power for operations of the electronic device 900. The display device 960 may be coupled to other components via the buses or other communication links. In an embodiment, the display device 960 may be included in the I/O device 940.

Although embodiments and implementations have been described herein, other embodiments and modifications will be apparent from this description. Accordingly, the invention is not limited to such embodiments, but rather to the broader scope of the appended claims and various obvious modifications and equivalent arrangements as would be apparent to a person of ordinary skill in the art.

What is claimed is:

1. A display device comprising:
   a display area including a light emitting element comprising a first electrode, an emission layer, and a second electrode facing the first electrode with the emission layer therebetween;
   a light transmission area corresponding to a functional module providing a function to the display device;

a boundary area between the light transmission area and the display area;
a first refractive layer having a first refractive index, the first refractive layer comprising:
 a refractive pattern which overlaps the emission layer of the light emitting element, in the display area, and an overcoat layer in the boundary area; and
a second refractive layer on the first refractive layer and having a second refractive index less than the first refractive index of the first refractive layer.

2. The display device of claim 1, wherein the second refractive layer overlaps the refractive pattern and the overcoat layer.

3. The display device of claim 1, further comprising a touch sensing layer in the display area, the touch sensing layer comprising:
a first touch insulating layer between the refractive pattern and the second refractive layer in the display area, and
the first touch insulating layer extended from the refractive pattern in the display area to the boundary area to cover the overcoat layer.

4. The display device of claim 3, wherein
each of the refractive pattern and the overcoat layer has an upper surface closest to the second refractive layer, and
the first touch insulating layer directly contacts the upper surface of the refractive pattern and the upper surface of the overcoat layer.

5. The display device of claim 3, wherein the first touch insulating layer has a third refractive index greater than the first refractive index of the first refractive layer.

6. The display device of claim 3, wherein the touch sensing layer further comprises:
a first touch electrode layer;
a second touch electrode layer connected to the first touch electrode layer; and
a second touch insulating layer facing the refractive pattern with the first touch insulating layer therebetween, the second touch insulating layer extended from the refractive pattern to the boundary area to cover the first touch electrode layer and the overcoat layer.

7. The display device of claim 6, wherein the second touch insulating layer has a fourth refractive index greater than the first refractive index of the first refractive layer.

8. The display device of claim 6, wherein
the second touch insulating layer has an upper surface furthest from the first refractive layer, and
the second refractive layer directly contacts the upper surface of the second touch insulating layer.

9. The display device of claim 3, wherein
the touch sensing layer further comprises in the display area:
 a first touch electrode layer between the first touch insulating layer and the second refractive layer; and
 a second touch electrode layer connected to the first touch electrode layer and on the second refractive layer, and
the second refractive layer extends from the refractive pattern in the display area to the boundary area to cover the first touch electrode layer and overlap the overcoat layer.

10. The display device of claim 9, wherein
the first touch insulating layer has an upper surface furthest from the first refractive layer, and
the second refractive layer directly contacts the upper surface of the first touch insulating layer.

11. The display device of claim 1, further comprising in order from the light emitting element, in the display area:

a first inorganic encapsulation layer;
an organic encapsulation layer; and
a second inorganic encapsulation layer
wherein
each of the refractive pattern and the overcoat layer has a lower surface furthest from the second refractive layer, and
the second inorganic encapsulation layer directly contacts the lower surface of the refractive pattern in the display area and extends from the refractive pattern to the boundary area to directly contact the lower surface of the overcoat layer.

12. The display device of claim 1, further comprising:
a substrate facing the second refractive layer with the light emitting element, the refractive pattern and the overcoat layer therebetween, and
at the boundary area, a groove in the substrate,
wherein the overcoat layer of the first refractive layer fills the groove in the substrate.

13. A method of providing a display device, the method comprising:
providing a light emitting element in a display area of the display device, a functional module in a light transmission area of the display device, and a boundary area between the display area and the light transmission area, the light emitting element comprising a first electrode, an emission layer, and a second electrode facing the first electrode with the emission layer therebetween;
providing an organic layer having a first refractive index, in the display area and the boundary area;
providing a first refractive layer having the first refractive index, by patterning the organic layer, the first refractive layer comprising a refractive pattern which is in the display area and overlaps the emission layer of the light emitting element, and an overcoat layer in the boundary area; and
providing a second refractive layer on the first refractive layer, the second refractive layer having a second refractive index less than the first refractive index of the first refractive layer.

14. The method of claim 13, wherein the second refractive layer overlaps the refractive pattern and the overcoat layer.

15. The method of claim 13, wherein the providing of the first refractive layer having the refractive pattern and the overcoat layer includes patterning the organic layer using a halftone mask.

16. The method of claim 13, further comprising providing a touch sensing layer in the display area, the touch sensing layer comprising:
a first touch insulating layer having a third refractive index greater than the first refractive index of the first refractive layer,
the first touch insulating layer between the refractive pattern and the second refractive layer in the display area,
the first touch insulating layer extended from the refractive pattern in the display area to the boundary area to cover the overcoat layer, and
a first touch electrode layer on the first touch insulating layer.

17. The method of claim 16, wherein the touch sensing layer in the display area further comprises:
a second touch insulating layer having a fourth refractive index greater than the first refractive index of the first refractive layer, the second touch insulating layer facing the refractive pattern with the first touch insulating layer therebetween, the second touch insulating layer extended from the refractive pattern to the boundary area to cover the first touch electrode layer and the overcoat layer, and a second touch electrode layer which is on the second touch insulating layer and connected to the first touch electrode layer.

18. The method of claim 16, wherein the touch sensing layer in the display area further comprises a second touch electrode layer on the second refractive layer and connected to the first touch electrode layer.

19. The method of claim 13, further comprising providing in order from the light emitting element, in the display area:

a first inorganic encapsulation layer which covers the light emitting element in the display area and extends from the light emitting element in the display area to the boundary area to face the overcoat layer;

an organic encapsulation layer facing the light emitting element with the first inorganic encapsulation layer therebetween; and a second inorganic encapsulation layer which covers the organic encapsulation layer in the display area and extends from the display area to the boundary area to face the overcoat layer, wherein the providing of the organic layer disposes the organic layer facing the first inorganic encapsulation layer with the second inorganic encapsulation layer therebetween.

* * * * *